(12) United States Patent
Tran

(10) Patent No.: US 7,781,247 B2
(45) Date of Patent: Aug. 24, 2010

(54) METHOD FOR PRODUCING GROUP III-GROUP V VERTICAL LIGHT-EMITTING DIODES

(75) Inventor: Anh Chuong Tran, Baoshan Township, Hsinchu County (TW)

(73) Assignee: SemiLEDs Optoelectronics Co., Ltd., Chu-Nan (TW)

(*) Notice: Subject to any disclaimer, the term of this patent is extended or adjusted under 35 U.S.C. 154(b) by 864 days.

(21) Appl. No.: 11/553,351

(22) Filed: Oct. 26, 2006

(65) Prior Publication Data
US 2008/0099780 A1 May 1, 2008

(51) Int. Cl.
*H01L 21/00* (2006.01)
(52) U.S. Cl. .............. 438/47; 438/29; 257/E21.087
(58) Field of Classification Search .............. 438/47, 438/46, 22, 29, 31, 32, 28
See application file for complete search history.

(56) References Cited

U.S. PATENT DOCUMENTS

| 5,290,393 A | 3/1994 | Nakamura | |
| 6,515,313 B1 * | 2/2003 | Ibbetson et al. | 257/103 |
| 2006/0154389 A1 * | 7/2006 | Doan | 438/21 |
| 2006/0154391 A1 * | 7/2006 | Tran et al. | 438/22 |
| 2007/0241351 A1 * | 10/2007 | Nijhawan et al. | 257/94 |

* cited by examiner

*Primary Examiner*—Walter L Lindsay, Jr.
*Assistant Examiner*—Reema Patel
(74) *Attorney, Agent, or Firm*—Patterson & Sheridan, LLP

(57) ABSTRACT

A method of producing one or more vertical light-emitting diode (VLED) dies having a light-emitting diode (LED) stack comprising Group III-Group V combinations of elements (e.g., GaN, AlN, InN, AlGaN, InGaN, and InAlGaN) and a metal substrate is provided. The techniques include forming an InGaN or InAlGaN interface layer above a suitable growth-supporting substrate, such as sapphire or silicon carbide (SiC), and forming the LED stack above the interface layer. Such an interface layer may absorb a majority of the energy from a laser pulse used during laser lift-off of the growth-supporting substrate in an effort to prevent damage to the light emitting layers of the LED stack, which may result in improved brightness performance over VLED dies produced with conventional buffer layers.

16 Claims, 13 Drawing Sheets

METHOD FOR PRODUCING GROUP III-GROUP V VERTICAL LIGHT-EMITTING DIODES

BACKGROUND OF THE INVENTION

1. Field of the Invention

Embodiments of the present invention generally relate to light-emitting diode (LED) semiconductor processing and, more particularly, to a method of producing vertical light-emitting diode (VLED) dies comprising Group III-Group V combinations of elements and a metal substrate.

2. Description of the Related Art

To produce blue, green, and ultraviolet vertical light-emitting diodes (VLEDs), various semiconductor materials are utilized, typically comprising combinations of elements from the Group III and Group V areas of the periodic table. Nitrogen being the most prevalent Group V element for such VLEDs, these combinations generally include GaN, AlN, AlGaN, and InGaN. However, layers of Group III-N compound semiconductor materials cannot simply be formed with high crystalline quality on conventional substrates of silicon, germanium, or GaAs, so epitaxial methods were developed using sapphire or silicon carbide (SiC) as a substrate instead.

Even still, the crystallinity and corresponding light emission efficiency of the semiconductor layers produced by these methods leaves room for improvement. Researchers discovered that forming a GaN or AlGaN buffer layer on the substrate before growing additional compound semiconductor layers improved the crystallinity and the light emission as disclosed in U.S. Pat. No. 5,290,393. To improve the thermal conductivity of VLEDs, however, a metal substrate may be coupled to the light-emitting diode (LED) stack, and the growth-supporting substrate of sapphire or SiC may be subsequently removed.

One technique for removing the growth-supporting substrate 102 involves laser lift-off as disclosed in U.S. published patent application 2006/0154389. This laser lift-off technique is illustrated in FIG. 1 where laser pulses 104 are implemented to sever the boundary between the substrate 102 and the buffer layer 106. With laser lift-off, however, shockwaves 108 from the laser pulses may travel throughout the LED stack 110 and may damage the critical light-emitting active layer 112. Damage to the active layer 112 may significantly reduce the brightness of the VLED as more defects could be introduced into the active layer in the form of non-radiative recombination centers.

Furthermore, intentional removal of the GaN or AlGaN buffer layer after removal of the growth-supporting substrate may cause further damage to the device. FIG. 2 is a microscope image 202 and a roughness analysis 204 of the surface of a VLED after removal of a GaN buffer layer. The atomic force microscope (AFM) image 202 appears noticeably rough, and the maximum depth 206 of 115.77 nm indicates the degree of damage to the crystalline structure of the VLED surface. The damage to the surface of the VLED may also be responsible for reduced brightness since shockwaves produced during removal may reach the active layer.

Accordingly, what is needed is an improved method of producing VLED dies.

SUMMARY OF THE INVENTION

One embodiment of the invention provides for a method for producing one or more vertical light-emitting diode (VLED) dies. The method generally includes growing an interface layer comprising at least one of InGaN and InAlGaN on a substrate for the dies; forming one or more light-emitting diode (LED) stacks above the interface layer; forming a metal layer above the LED stacks; removing the substrate and at least a portion of the interface layer; and separating the LED stacks along with corresponding sections of the metal layer above the LED stacks to produce the one or more VLED dies.

Another embodiment of the present invention provides for an interface layer. The interface layer generally comprises at least one of InGaN and InAlGaN and is disposed adjacent to an LED stack of a VLED die having a metal layer disposed above the LED stack.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention described herein provide techniques and structures useful for producing one or more vertical light-emitting diode (VLED) dies having a light-emitting diode (LED) stack comprising Group III-Group V (and more particularly, Group III-N) combinations of elements (e.g., GaN, AlN, InN, AlGaN, InGaN, and InAlGaN) and a metal substrate. The techniques include forming an InGaN or InAlGaN interface layer above a suitable growth-supporting substrate, such as sapphire or silicon carbide (SiC), and forming the LED stack above the interface layer. Such an interface layer may absorb a majority of the energy from a laser pulse used during laser lift-off of the growth-supporting substrate in an effort to prevent damage to the light-emitting active layers of the LED stack, which may result in improved brightness performance over VLEDs produced with conventional buffer layers comprising, for example, GaN or AlN.

An Exemplary Interface Layer

Figure 3:
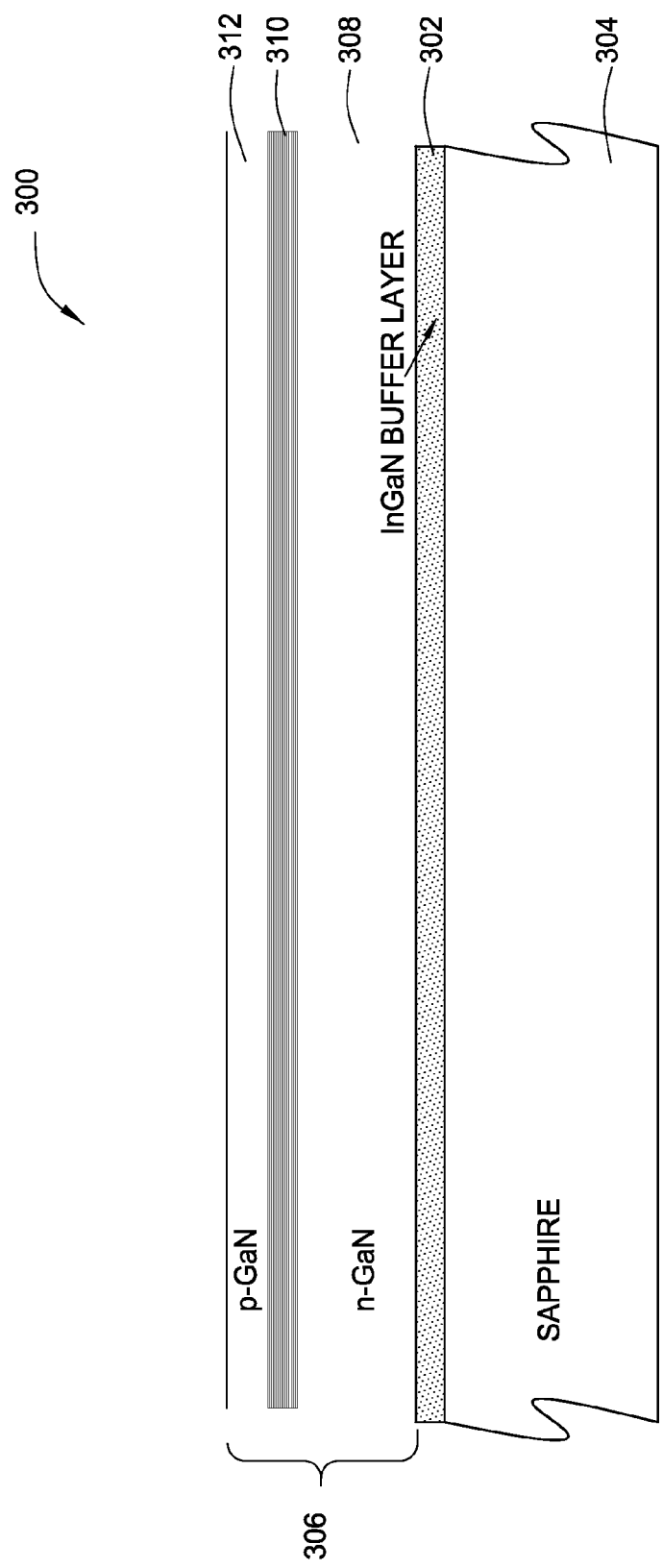
FIG. 3 is a cross-sectional schematic representation of an LED stack grown on an InGaN interface layer in accordance with an embodiment of the invention.

FIG. 3 is a cross-sectional schematic representation 300 of such an interface layer 302 grown above a substrate 304 suitable for supporting the growth of the interface layer 302. The interface layer 302 may comprise InGaN or InAlGaN, although InGaN interface layers will be described and illustrated in the exemplary embodiments presented henceforth. As such, the substrate 304 may comprise sapphire or silicon carbide (SiC), for example, which allow for crystal growth of Group III-Group V combinations of elements. More specifically, the interface layer 302 may comprise $In_xGa_{1-x}N$ where $x>0.05$ and have a thickness between 5 nm and 300 nm. An LED stack 306 comprising an n-doped layer 308 (e.g., n-GaN), a multiple quantum well (MQW) active layer 310 for light emission disposed above the n-doped layer 308, and a p-doped layer 312 (e.g., p-GaN) disposed above the active layer 310 may be formed above the interface layer 302 with improved crystallinity and surface morphology over conventional growth methods without an interface layer.

Figure 4:
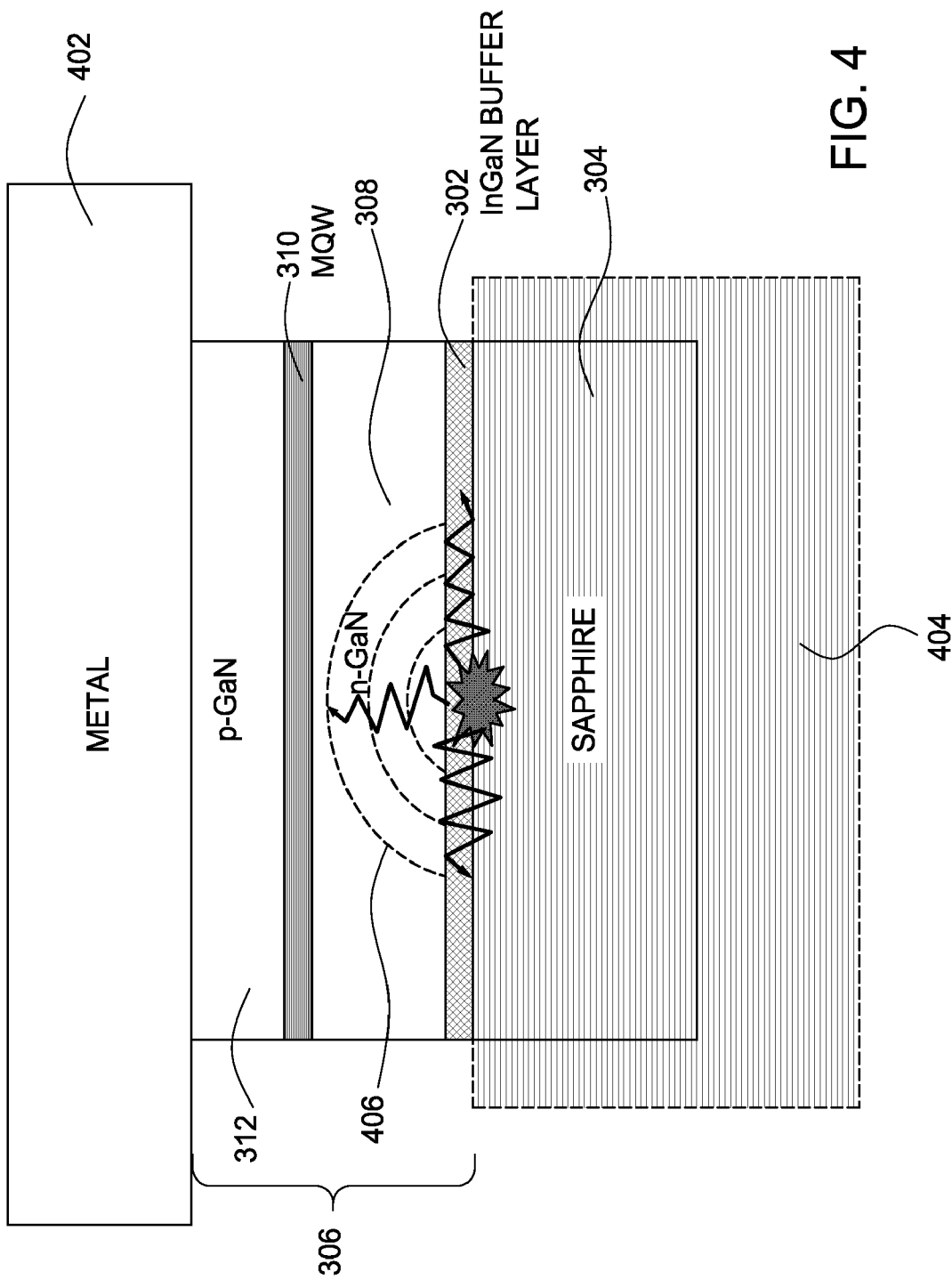
FIG. 4 is a cross-sectional schematic representation illustrating the shockwave resulting from an applied laser pulse to remove the sapphire substrate from a VLED having an LED stack grown on an InGaN interface layer in accordance with an embodiment of the invention.

Referring now to FIG. 4, a VLED die is depicted with a metal layer 402 disposed above the p-doped layer 312 of the LED stack 306 during the course of production, which may become the metal substrate for the VLED die. The metal substrate may provide for more efficient heat transfer away from the LED stack 306 during operation when compared with conventional VLEDs with a sapphire or SiC substrate 304. For VLEDs with a metal substrate, the growth-supporting substrate 304 may be removed from the semiconductor structure after the LED stack 306 and the metal layer 402 have been formed. One suitable technique for removing the growth-supporting substrate 304 may be laser lift-off using a laser with a 248 nm wavelength, for example.

With the laser lift-off technique, bursts of laser pulses 404 may be targeted at various locations along or near the boundary between the interface layer 302 and the growth-supporting substrate 304 in an effort to fracture the boundary and break the substrate 304 away from the remaining portion of the structure. Compared with a conventional GaN buffer layer, the InGaN interface layer 302 may absorb more of the energy from the laser, and therefore, a shockwave 406 resulting from the laser pulse 404 may have a shorter radius that may not reach the light-emitting active layer 310. Thus, the InGaN interface layer 302 may prevent damage to the active layer 310 during laser lift-off.

This phenomenon can be explained by comparing the absorption coefficients of InGaN interface layers with conventional GaN buffer layers. The absorption coefficient ($\alpha$) of a laser beam is a measure of the attenuation caused by absorption of energy resulting from the beam's passage through a material. Absorption coefficients are expressed in units of reciprocal distance from the equation $I=I_o e^{-\alpha d}$, where $I_o$ is the original intensity and I is the intensity of the laser after it penetrates a distance d in the material. The absorption coefficients of GaN and InN for a 248 nm wavelength laser are $2\times10^5$ cm$^{-1}$ and $8\times10^5$ cm$^{-1}$, respectively [J. F. Muth, J. H. Lee, I. K. Shmagin, R. M. Kolbas, H. C. Casey, Jr., B. P. Keller, U. K. Mishra, and S. P. DenBaars. "Absorption Coefficient, Energy Gap, Exciton Binding Energy, and Recombination Lifetime of GaN Obtained from Transmission Measurements," Appl. Phys. Lett. 71(18) (1997), 2572-2574 and Q. Guo and A. Yoshida. "Temperature Dependence of Band Gap Change in InN and AlN," Jpn. J. Appl. Phys. 33 (1994), 2453-2456]. Thus, an InGaN interface layer should absorb more laser energy than a GaN buffer layer having the same thickness, resulting in higher temperature to facilitate the InGaN melting for separation of the growth-supporting substrate from the remaining portion of the VLED structure. Laser energy not absorbed in the interface layer may proceed in the form of shock waves. Therefore, the energy of the shock waves may be much less when an InGaN interface layer is employed when compared to a conventional GaN buffer layer.

After removing the growth-supporting substrate 304 via the laser lift-off technique, all or at least a portion of the interface layer 302 may be eradicated. Because a portion of the interface layer 302 may remain, the interface layer 302 may be n-doped, although an undoped interface layer may suffice. As another advantage, the use of an InGaN interface layer 302 in VLEDs may lead to reduced surface roughness and better brightness performance when compared with VLEDs produced with conventional GaN buffer layers upon removal of at least some of the interface layer 302. The improved brightness may be attributed to reduced damage to the active layer 310.

Figure 1:
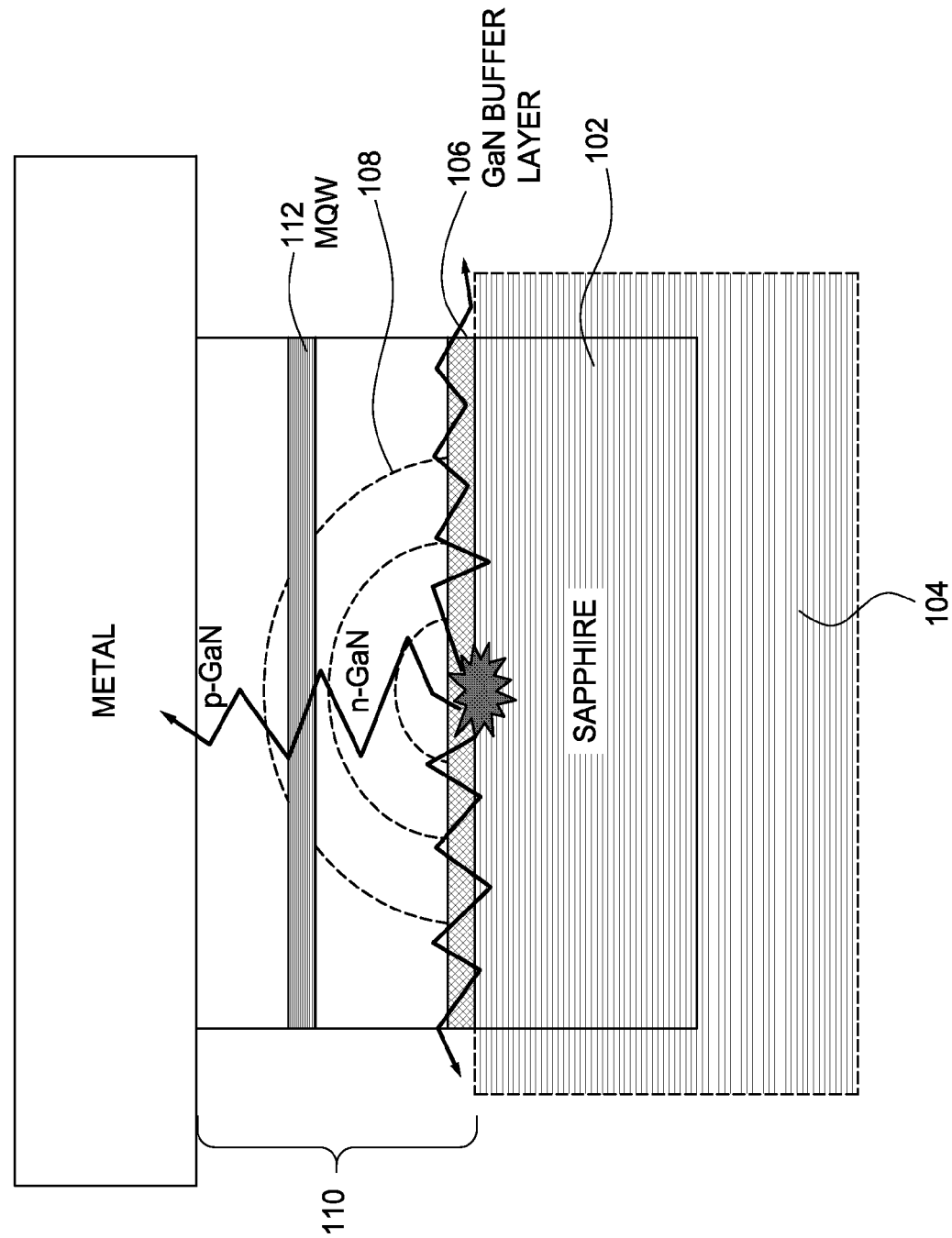
FIG. 1 is a cross-sectional schematic representation illustrating the shockwave resulting from an applied laser pulse to remove the sapphire substrate from a vertical light-emitting diode (VLED) having an LED stack grown on a GaN buffer layer in accordance with the prior art.
Figure 2:
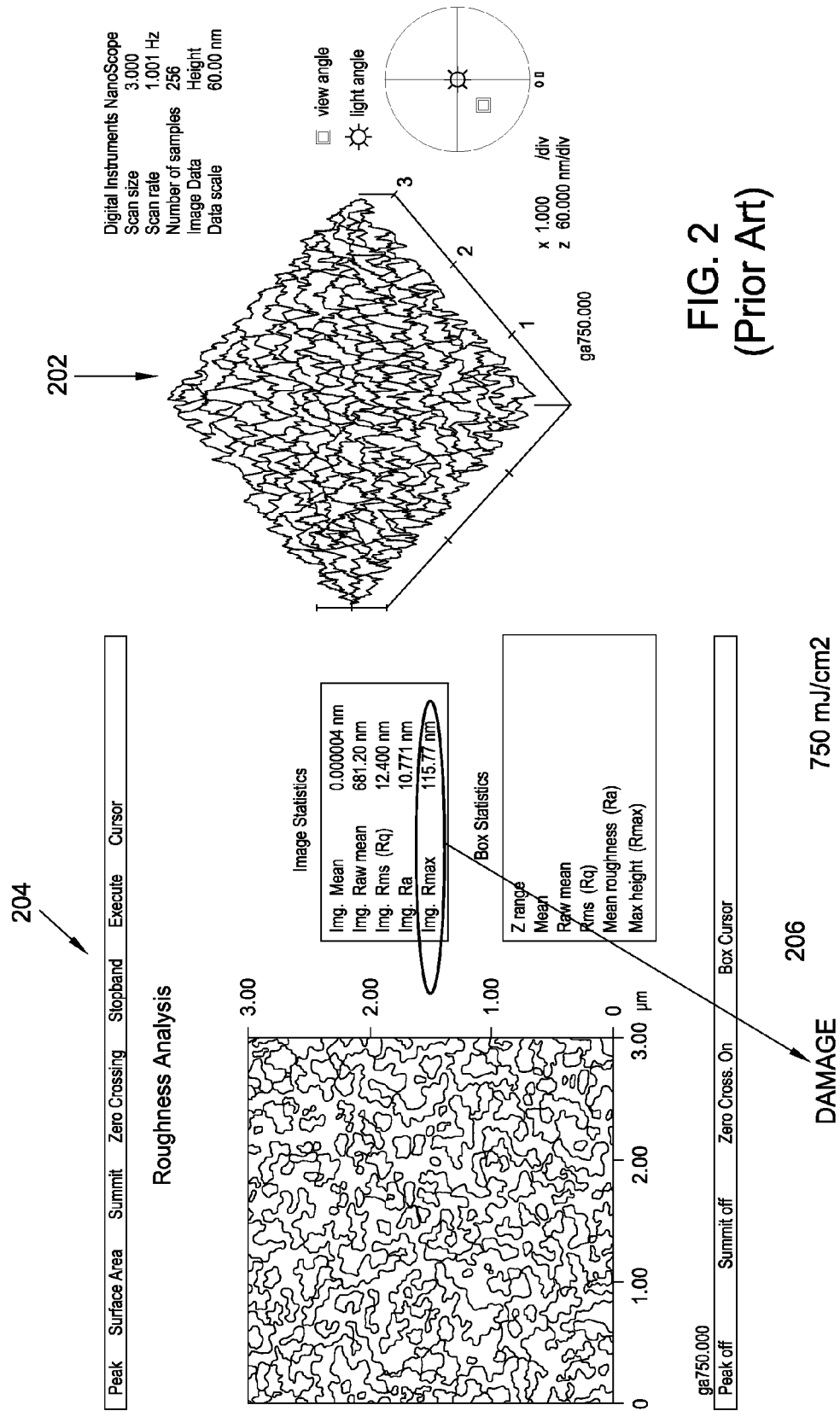
FIG. 2 is an atomic force microscope (AFM) image and a roughness analysis of the surface of a VLED after removal of the GaN buffer layer in accordance with the prior art.
Figure 5:
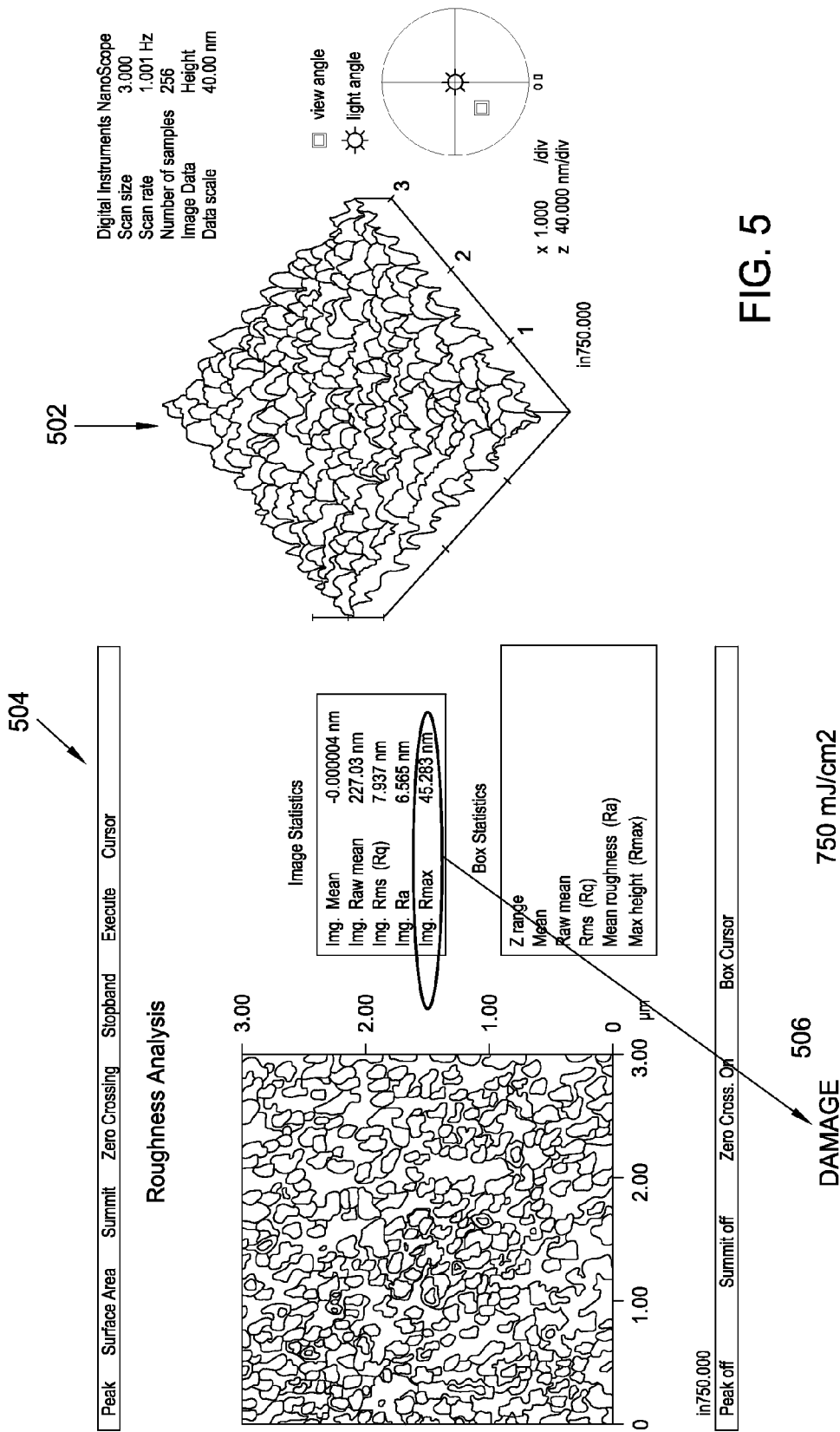
FIG. 5 is an AFM image and a roughness analysis of the surface of a VLED after removal of the InGaN interface layer in accordance with an embodiment of the invention.

FIG. 5 is an atomic force microscope (AFM) image 502 and a roughness analysis 504 of the surface of a VLED after removal of the InGaN interface layer 302. The microscope image 502 in FIG. 5 appears noticeably smoother than the microscope image 202 in FIG. 2 of a VLED surface after removal of a conventional GaN buffer layer. Also, the maximum depth 506 may be indicative of the damage to the crystalline structure of the n-doped layer 308. In FIG. 5, the maximum depth 506 is only 45.283 nm, significantly smaller than the maximum depth 206 of 115.77 nm in the prior art roughness analysis 204 of FIG. 2.

The smoother surface occurring with an InGaN interface layer may be due to the much higher absorption coefficient of InGaN when compared to elemental Ga, In, or N. This characteristic may permit the use of a laser with lower energy when separating the growth-supporting substrate 304 from the VLED structure. Using a lower energy laser may result in less damage to the remaining portion of the VLED structure.

An Exemplary Production Method

Now that an example of an InGaN interface layer and its advantages have been explained, an exemplary method for producing VLED dies with a metal substrate with the use of said interface layer will now be described.

Figure 6:
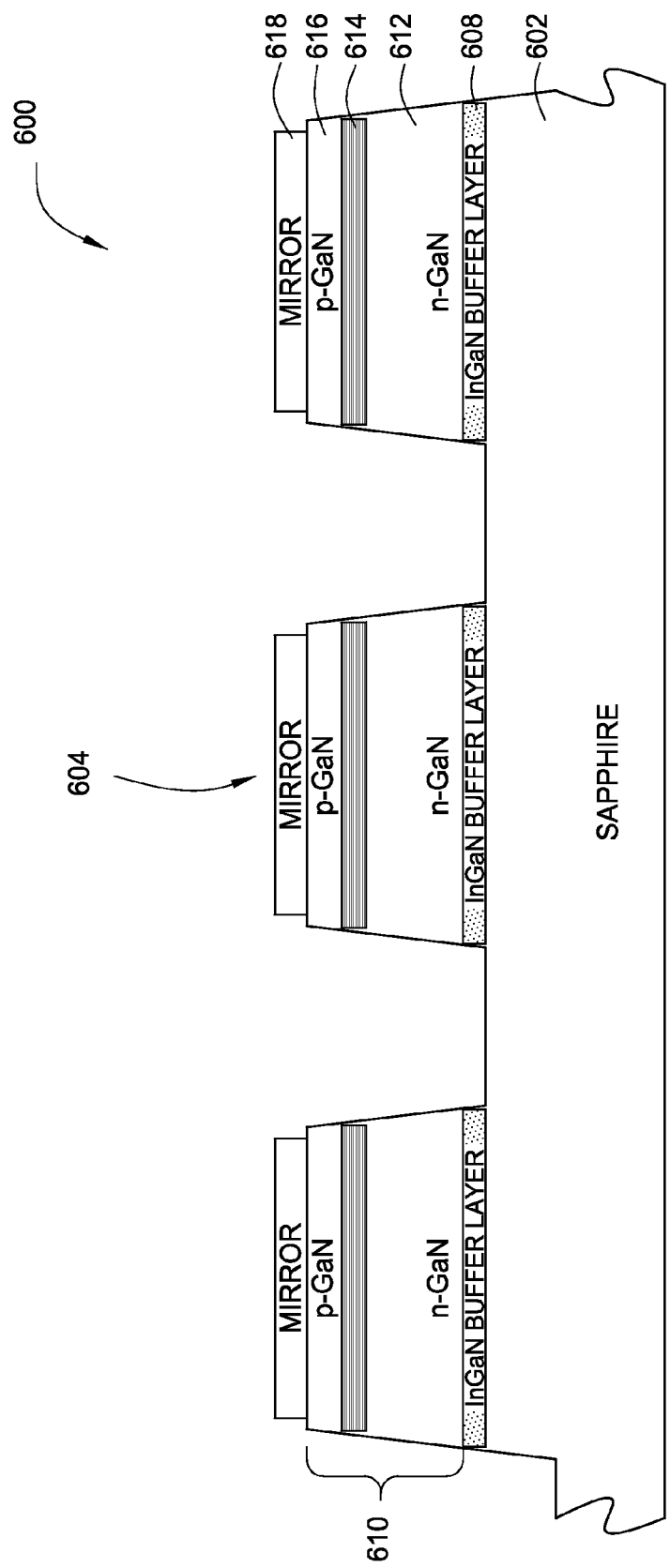
FIG. 6 is a cross-sectional schematic representation of a section of a wafer having multiple LED stacks of a VLED grown on an InGaN interface layer in accordance with an embodiment of the invention.

In FIG. 6, a wafer 600 comprising a suitable substrate 602 for growing Group III-Group V combinations of elements (e.g., GaN, AlN, InN, InGaN, AlGaN, and InAlGaN) may be provided. A surface of the substrate 602 may be patterned with grooves or notches to support the epitaxial growth of numerous semiconductor dies, such as VLED dies 604.

To form the multilayered structure of the VLED dies 604, an interface layer 608 comprising InGaN (or InAlGaN) may be grown on the growth-supporting substrate 602 at a temperature around 500° C. The interface layer 608 may serve to improve the crystallinity of other Group III-Group V layers to be grown above the interface layer 608 in comparison to conventional methods of producing VLED dies without an interface layer. Having the advantages of reduced damage to the light-emitting region and increased brightness for VLED dies described herein, the interface layer 608 may comprise $In_xGa_{1-x}N$, where x>0.05 and have a thickness between 5 nm and 300 nm.

Above the interface layer 608, LED stacks 610 may be formed using various growth techniques, such as metal organic chemical vapor deposition (MOCVD), molecular beam epitaxy (MBE), and hydride vapor phase epitaxy (HVPE). The LED stack 610 may comprise an n-doped layer 612 formed above the interface layer 608, a light-emitting multiple quantum well (MQW) active layer 614 formed above the n-doped layer 612, and a p-doped layer 616 formed above the active layer 614. The n-doped layer 612, the active layer 614, and the p-doped layer 616 may be composed of Group III-Group V combinations of elements in the ratio $Al_xIn_yGa_{1-x-y}N$, where $0 \leq x \leq 1$ and $0 \leq y \leq 1-x$, and the various layers 612, 614, 616 may comprise the same or different combinations of elements from one another.

For some embodiments, a reflective layer 618 may be formed above the LED stacks 610. The reflective layer 618 may reflect light emitted from the active layer 614 when the VLED die 604 is forward biased and redirect it in a general light emitting direction for a VLED device in an effort to increase the light extraction. The reflective layer may comprise any suitable material for reflecting light, such as Ag, Al, Ni, Pd, Au, Pt, Ti, Cr, Vd, and their alloys.

Figure 7:
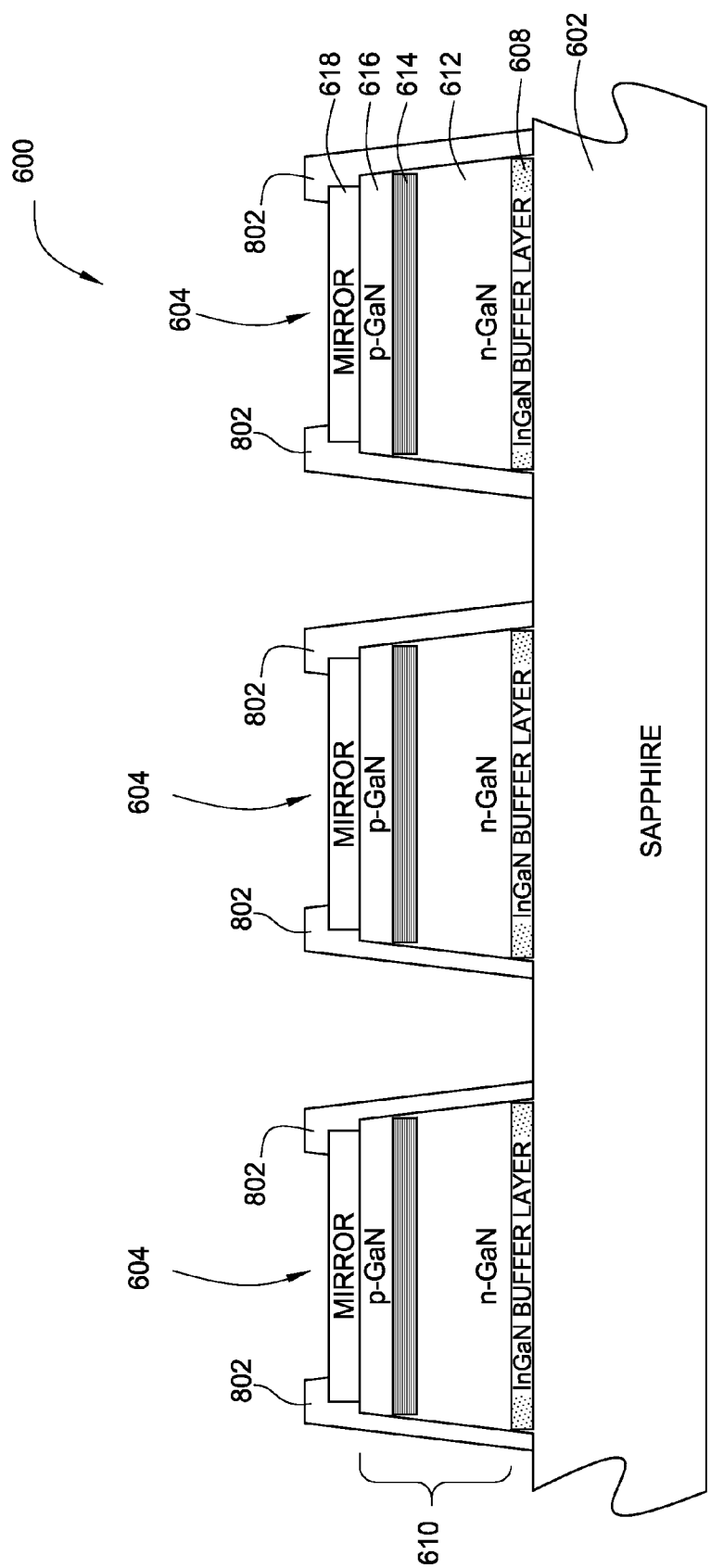
FIG. 7 illustrates adding passivation to the LED stacks of FIG. 6 in accordance with an embodiment of the invention.

Areas 802 between the VLED dies 604 may be passivated in an effort to protect the underlying structures as illustrated in FIG. 7.

Figure 8:
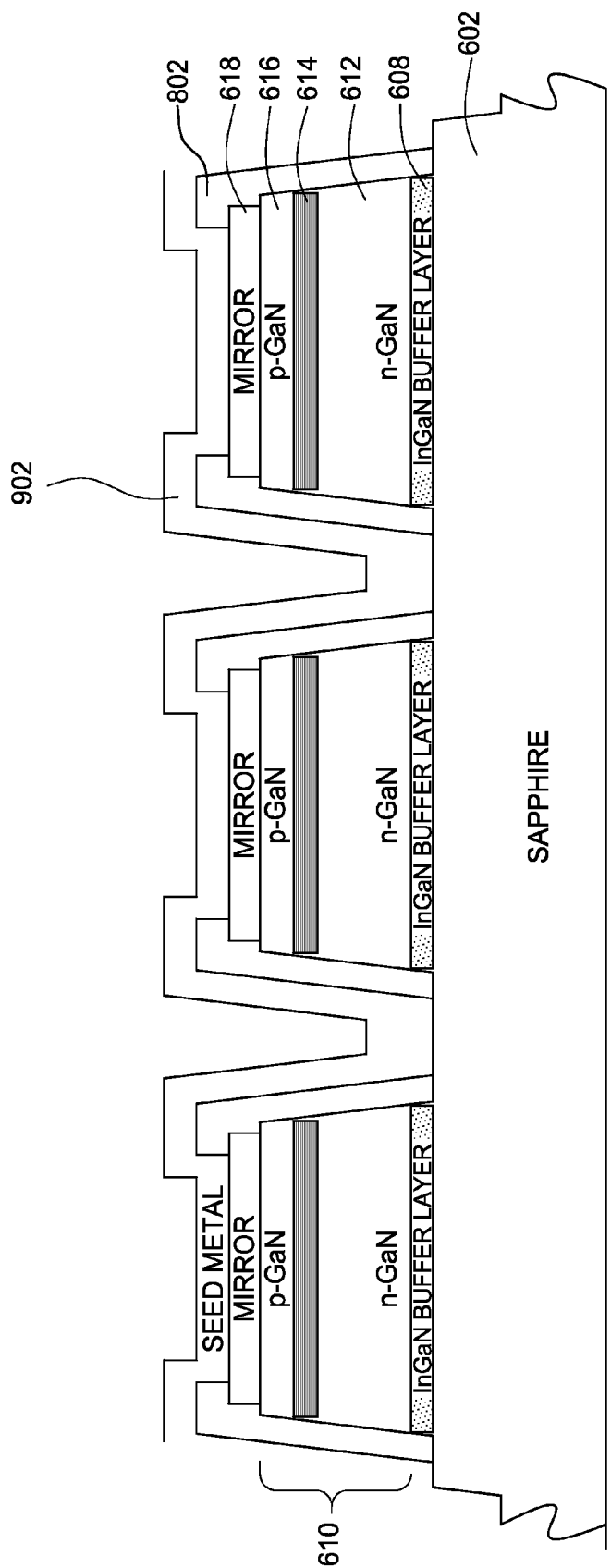
FIG. 8 illustrates creating a seed metal layer above the structures in the wafer of FIG. 7 in accordance with an embodiment of the invention.
Figure 9:
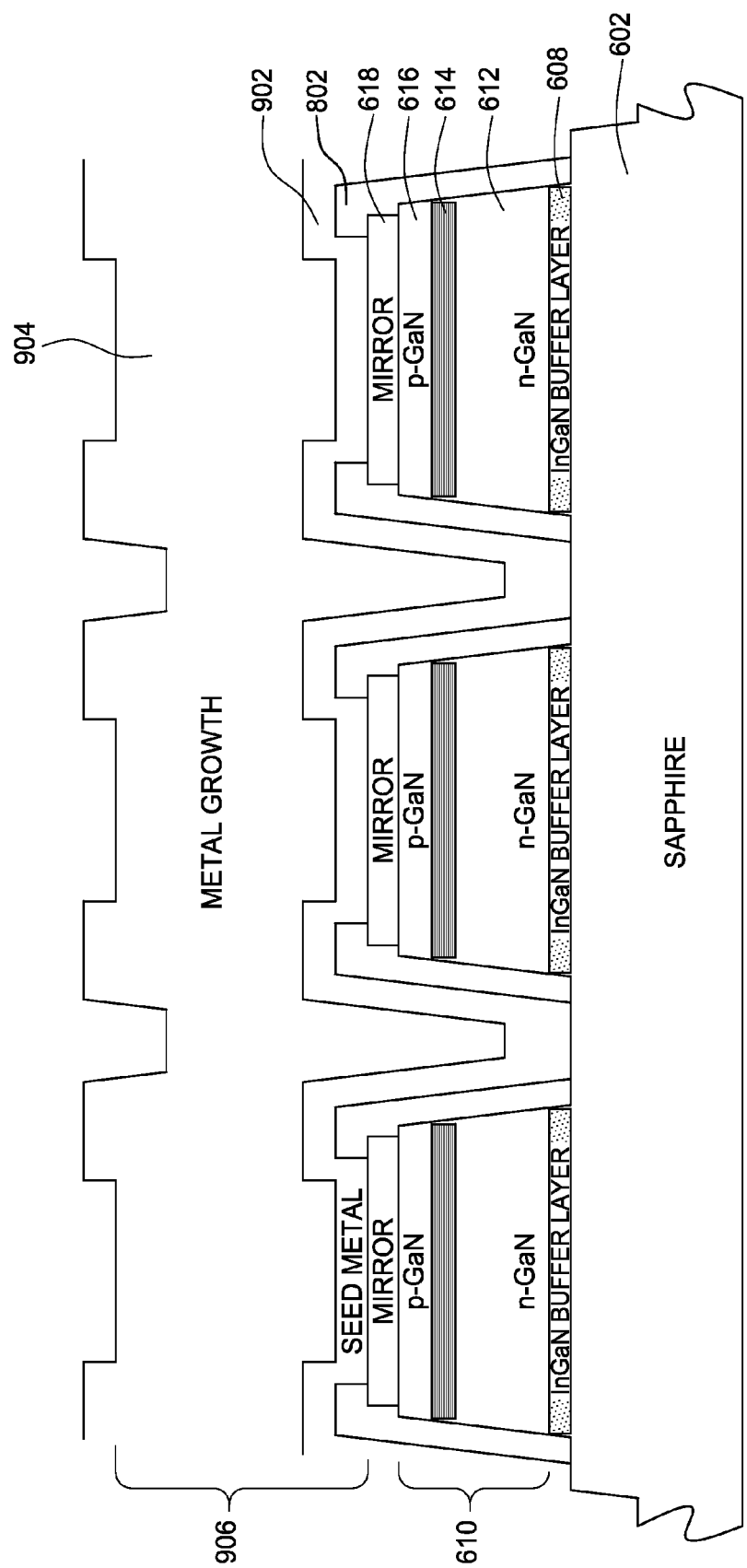
FIG. 9 illustrates forming additional metal above the seed metal layer of FIG. 8 in accordance with an embodiment of the invention.

After the wafer 600 has been properly prepared, a seed metal layer 902 may be formed above the structures formed thus far as shown in FIG. 8. The seed metal layer 902 may be formed by metal evaporation, such as e-beam evaporation, or electroless plating and may allow for the efficient growth of subsequent, additional metal 904 to a desired thickness as shown in FIG. 9. The additional metal 904 may be formed by electroplating, electroless plating, metal evaporation, or chemical vapor deposition (CVD) and may comprise a single layer or multiple layers, consisting of the same material or different materials. Both the seed metal layer 902 and the additional metal 904 may form a metal layer 906 for the VLED dies 604 and may comprise a metal or a metal alloy, such as Cu, Ni, Ag, Au, Al, Cu—Co, Ni—Co, Cu—W, Cu—Mo, Ni/Cu, and Ni/Cu—Mo. The metal layer 906 may be continuous (i.e., covering the VLED dies 604 and areas in between) to allow for handling of the structure once the growth-supporting substrate 602 is removed.

Figure 10:
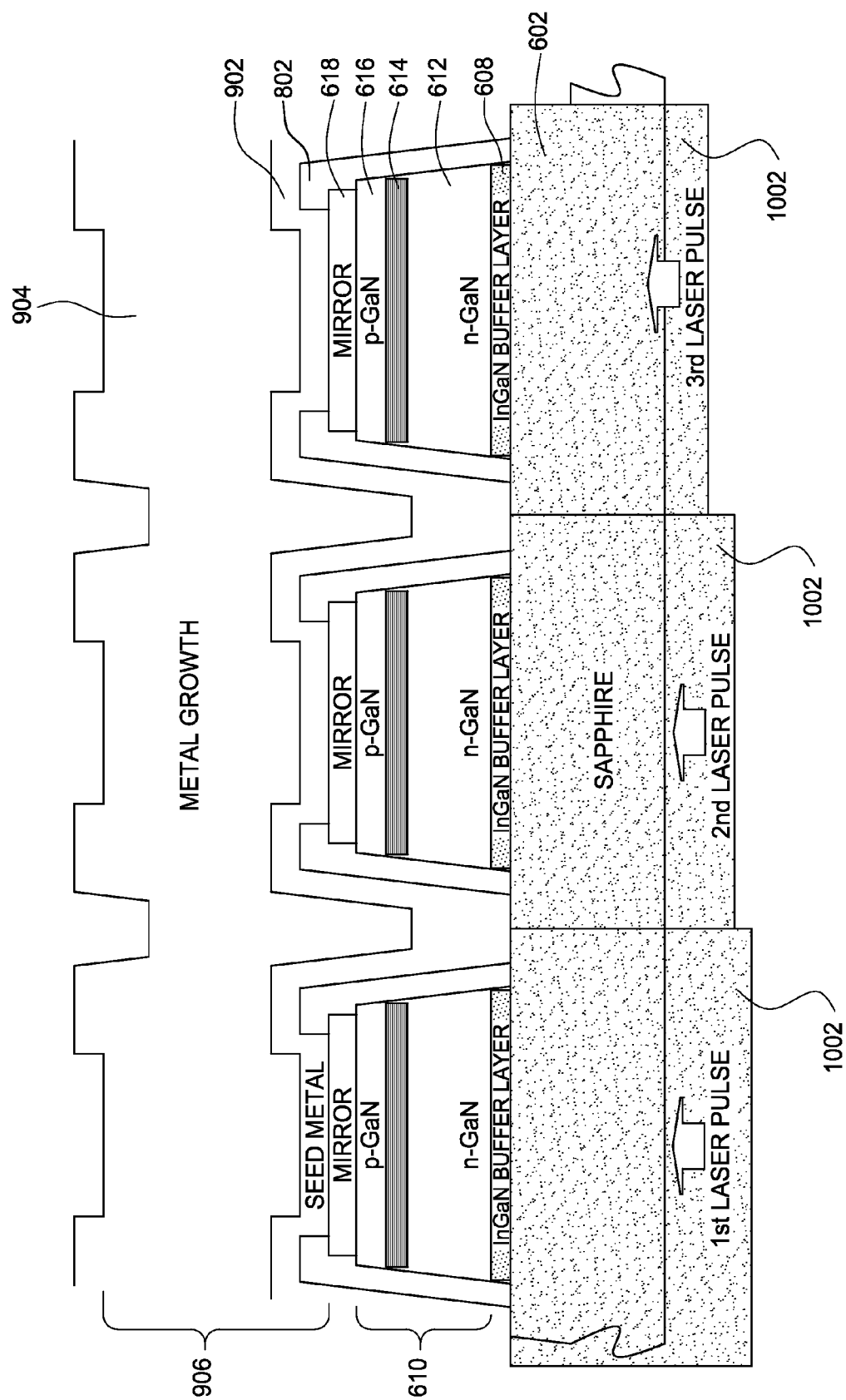
FIG. 10 illustrates applying laser pulses to the structures in FIG. 9 in an effort to remove the sapphire substrate in accordance with an embodiment of the invention.

Once the metal layer 906 has been constructed, the growth-supporting substrate 602 may no longer be necessary for a VLED device with a metal substrate. Removal may be accomplished by any suitable technique or combinations thereof, such as plasma etching, wet chemical etching, photo-enhanced chemical etching, laser lift-off, grinding, or polishing. As illustrated in FIG. 10 for some embodiments, a laser lift-off technique comprising a series of laser pulses 1002 aimed at or near a boundary between the growth-supporting substrate 602 and the InGaN interface layer 608 may be utilized to separate this substrate 602 from the interface layer 608 and the other components of the structure. The wavelength of a suitable laser may be 248 nm. With an InGaN interface layer 608, energy from the laser pulses 1002 may be substantially absorbed, and the resulting shockwaves may not reach the light-emitting active layer 614 of the VLED dies 604 (see FIG. 4). Thus, the InGaN interface layer 608 may prevent damage to the active layer 614, thereby allowing for better brightness performance over conventional VLED dies produced with a GaN or AlN buffer layer.

Figure 11:
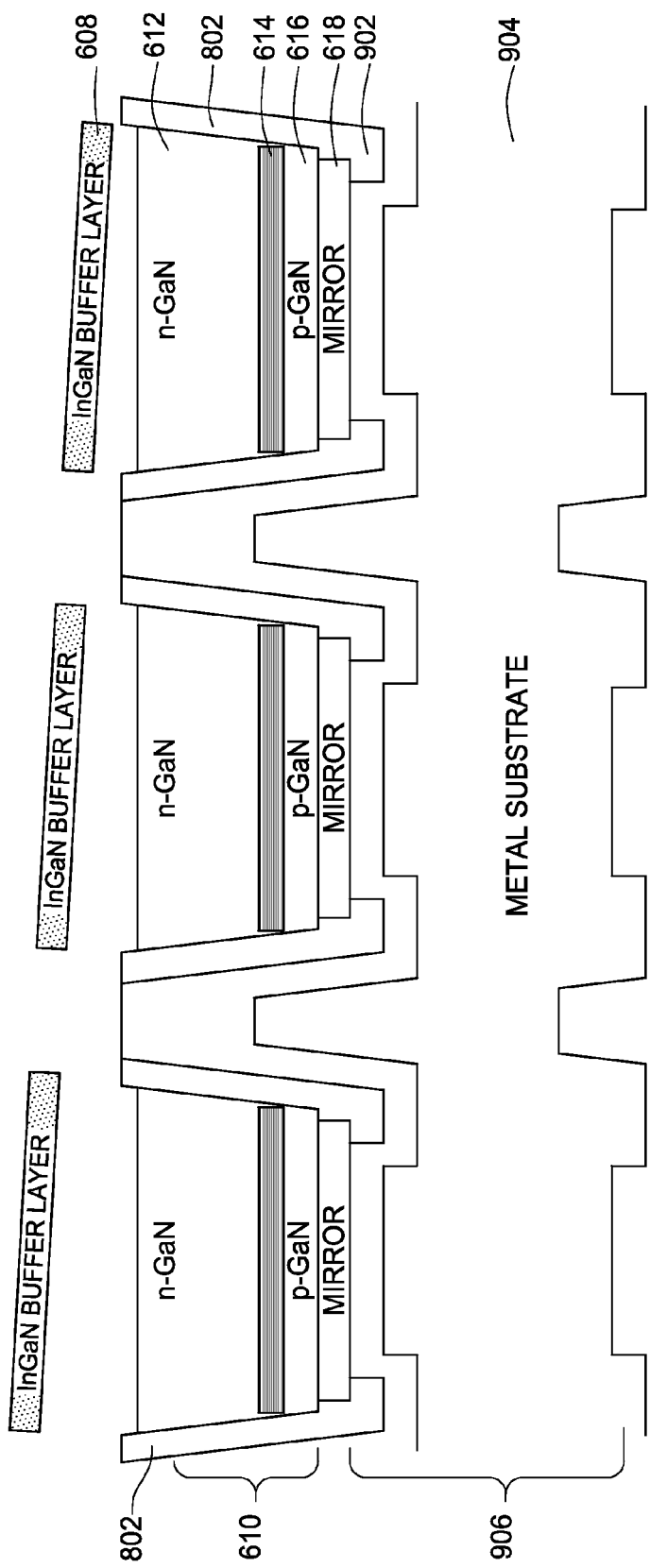
FIG. 11 illustrates removing the InGaN interface layer after the sapphire substrate has been removed in accordance with an embodiment of the invention.
Figure 12:
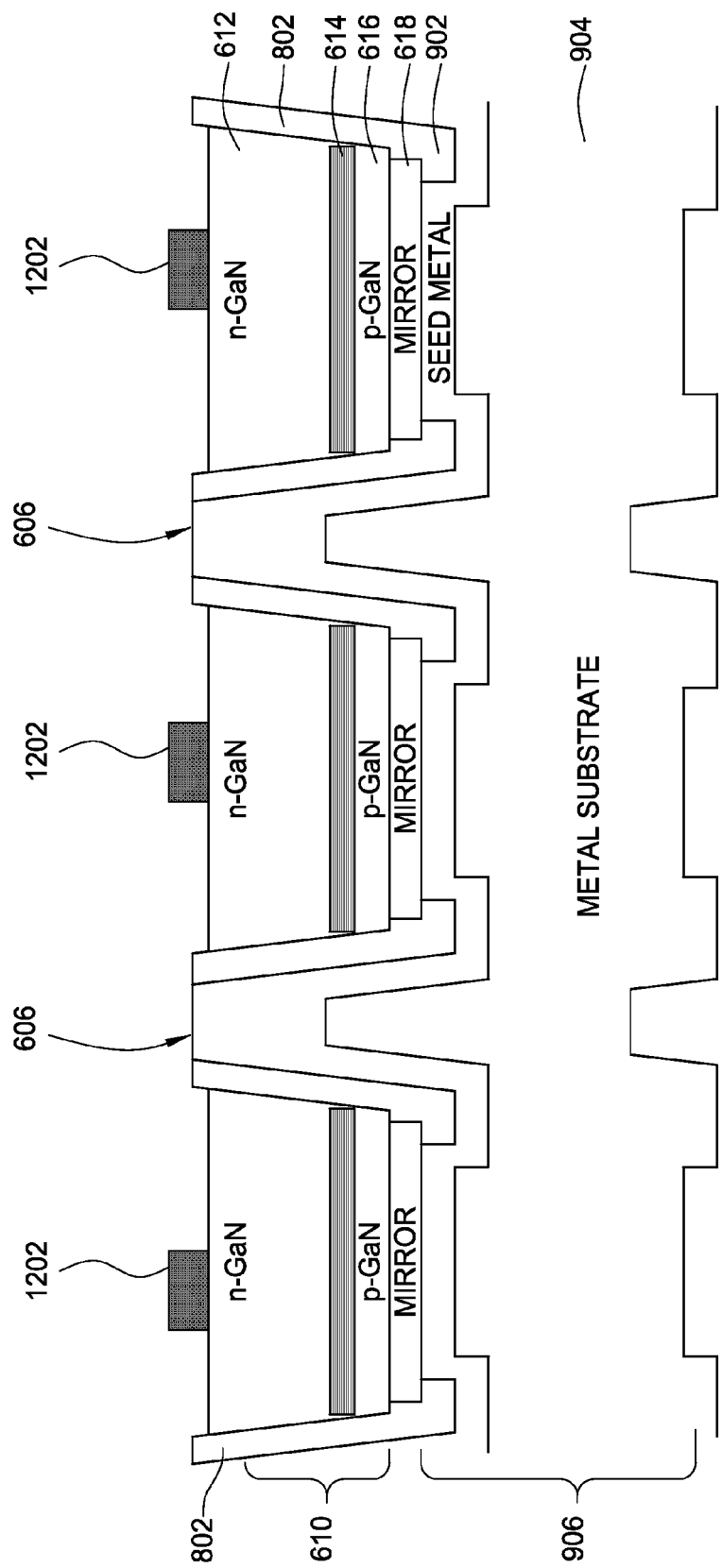
FIG. 12 illustrates adding electrodes to the n-doped layer of the LED stacks in accordance with an embodiment of the invention.

After removal of the growth-supporting substrate 602, all or a portion of the InGaN interface layer 608 may be removed as illustrated in FIG. 11. The removal may be accomplished be any suitable technique, such as wet etching, dry etching, and photo-electrochemical etching, known to those skilled in the art, and the wafer 600 may be flipped over to accomplish this. As described herein, the use of an InGaN interface layer 608 in producing VLED dies 606 may lead to reduced surface roughness and better brightness performance when compared with VLEDs produced with conventional GaN buffer layers upon removal of at least some of the interface layer 608 (see FIG. 5).

Figure 13:
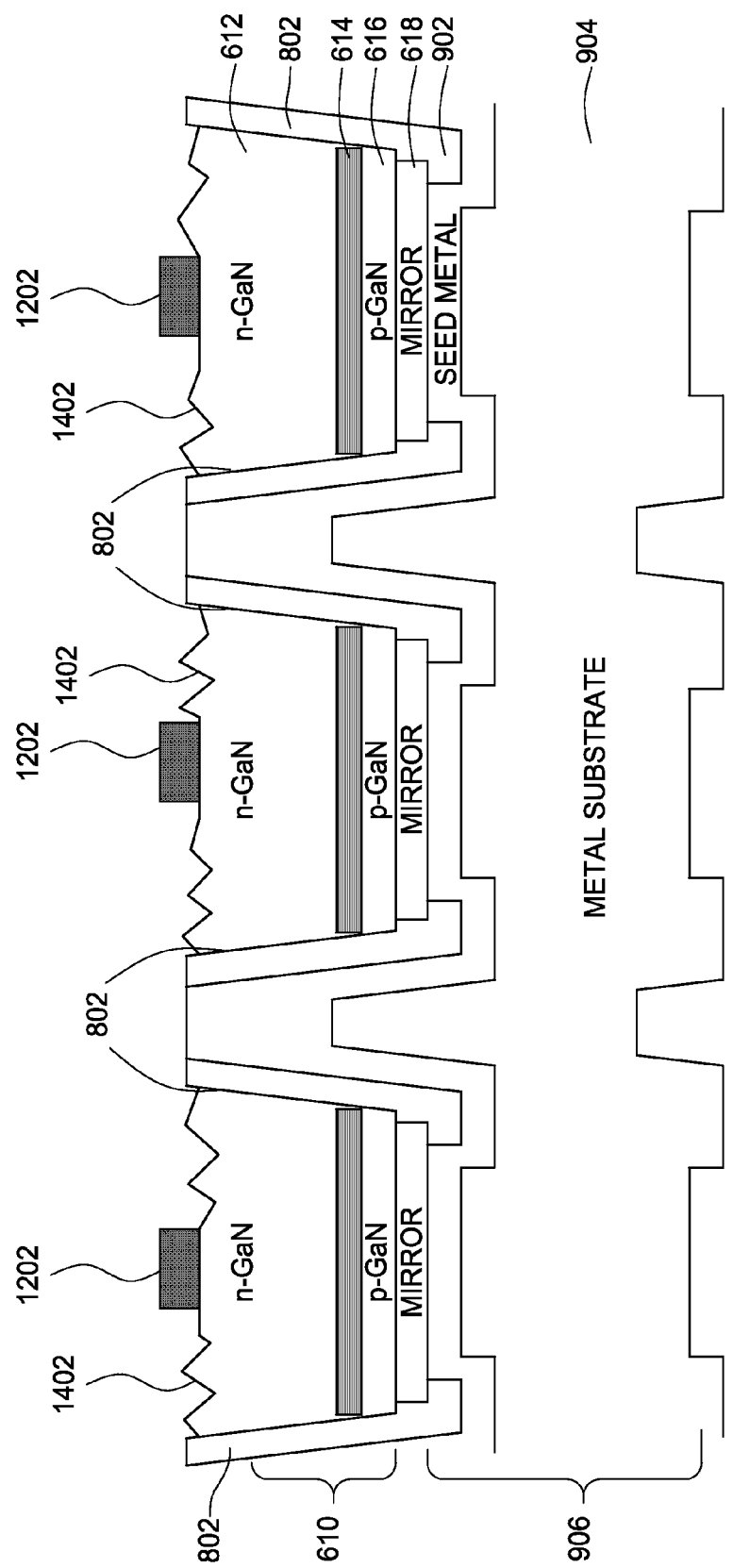
FIG. 13 illustrates patterning the surface of the n-doped layer of the LED stacks in accordance with an embodiment of the invention.

Once the InGaN interface layer 608 has been removed, a surface of the n-doped layer 612 should be exposed and may be operated on. In FIG. 13, bonding pads 1202 for external connection to the VLED dies 604 may be fabricated on the topside of the working structure. In addition, the surface of the working semiconductor structure with bonding pads 1202 may be protected by a temporary protection layer (not shown) in an effort to avoid contamination from subsequent die separation, especially in the cases involving cutting. The protection layer may comprise a combination of materials (e.g., wax, epoxy, a polymer, thermoplastic, a polyimide, a parylene, epoxy, resist, $SiO_2$, $Si_3N_4$, ZnO, $Ta_2O_5$, $TiO_2$, HfO, or MgO), and the thickness of the protection layer may be greater than 100 Å.

Referring to FIG. 13, the surface 1402 of the exposed n-doped layer 612 may be roughened. For some embodiments where a portion of the InGaN interface layer 608 remains, the exposed surface of the remaining interface layer 608 may be roughened. This roughening may be accomplished using any suitable method, including wet etching, dry etching, and photolithography with etching. Such roughening may increase the surface area of the n-doped layer 612 or the remaining interface layer 608, thereby improving the light extraction.

To fabricate individual VLED devices, the working semiconductor structure may be diced (i.e., separated into individual VLED dies 604) using various suitable techniques. The individual VLED dies may be further packaged and assembled in an effort to provide a degree of protection and easily accessible interfaces for external connection. Since these separation and packaging techniques are well known to those skilled in the art, they will not be described further.

While the foregoing is directed to embodiments of the present invention, other and further embodiments of the invention may be devised without departing from the basic scope thereof, and the scope thereof is determined by the claims that follow.

The invention claimed is:
1. A method for producing one or more vertical light-emitting diode (VLED) dies, the method comprising:
growing an interface layer comprising at least one of InGaN and InAlGaN on a substrate for the dies;
forming one or more light-emitting diode (LED) stacks above the interface layer;
forming a metal layer above the LED stacks;

removing the substrate and at least a portion of the interface layer, wherein removing the substrate produces shockwaves that are at least partially absorbed by the interface layer; and separating the LED stacks along with corresponding sections of the metal layer above the LED stacks to produce the one or more VLED dies.

2. The method of claim 1, wherein the interface layer comprises InGaN in the ratio $In_xGa_{1-x}N$ where $x>0.05$.

3. The method of claim 1, wherein the interface layer has a thickness between 5 nm and 300 nm.

4. The method of claim 1, wherein the substrate comprises at least one of sapphire and silicon carbide (SiC).

5. The method of claim 1, wherein forming the LED stacks comprises:

forming an n-doped layer above the interface layer;

forming an active layer for emitting light above the n-doped layer; and forming a p-doped layer above the active layer.

6. The method of claim 5, wherein the p-doped layer, the n-doped layer, or the active layer comprises $Al_xIn_yGa_{1-x-y}N$, where $0 \leq x \leq 1$ and $0 \leq y \leq 1-x$.

7. The method of claim 1, wherein forming the metal layer above the LED stacks comprises depositing a seed metal layer above the LED stacks and forming a remaining portion of the metal layer above the seed metal layer.

8. The method of claim 1, wherein the metal layer comprises a single layer or multiple layers.

9. The method of claim 1, wherein the metal layer is a metal or a metal alloy comprising at least one of Cu, Ni, Ag, Au, Al, Cu—Co, Ni—Co, Cu—W, Cu—Mo, Ni/Cu, and Ni/Cu—Mo.

10. The method of claim 1, further comprising forming a reflective layer disposed between the one or more LED stacks and the metal layer.

11. The method of claim 10, wherein the reflective layer comprises at least one of Ag, Al, Ni, Pd, Au, Pt, Ti, Cr, Vd, and combinations thereof.

12. The method of claim 1, wherein removing the substrate comprises applying one or more laser pulses at or near a boundary between the substrate and the interface layer.

13. The method of claim 1, wherein shockwaves that are at least partially absorbed by the interface layer do not damage a light-emitting active layer of the LED stacks.

14. The method of claim 1, wherein removing the at least a portion of the interface layer comprises at least one of wet etching, dry etching, and photo-electrochemical etching the interface layer.

15. The method of claim 1, further comprising roughening the surface of the VLED dies exposed after removing the substrate and the at least a portion of the interface layer.

16. The method of claim 1, further comprising adding one or more bonding pads to the VLED dies, wherein each bonding pad is coupled to each of the one or more LED stacks, after removing the substrate and the at least a portion of the interface layer.

* * * * *